(12) United States Patent
Chiu

(10) Patent No.: US 6,483,361 B1
(45) Date of Patent: Nov. 19, 2002

(54) LOCK DETECTOR FOR DETERMINING PHASE LOCK CONDITION IN PLL ON A PERIOD-BY-PERIOD BASIS ACCORDING TO DESIRED PHASE ERROR

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/860,966

(22) Filed: May 18, 2001

(51) Int. Cl.[7] ................................................. H03L 7/06
(52) U.S. Cl. ........................ 327/159; 327/20; 327/26; 327/157; 375/376; 331/1 A; 331/DIG. 2
(58) Field of Search ................................ 327/146–148, 327/150, 155–159, 162, 18, 20, 26, 31, 3, 5, 12; 331/14, 17, 25, 11, DIG. 2; 375/373–376; 365/233, 233.5

(56) References Cited

U.S. PATENT DOCUMENTS

| | | | | |
|---|---|---|---|---|
| 4,806,878 A | * | 2/1989 | Cowley | 331/1 A |
| 5,327,103 A | * | 7/1994 | Baron et al. | 331/1 A |
| 5,905,410 A | * | 5/1999 | Holmes et al. | 327/159 |
| 5,969,576 A | * | 10/1999 | Trodden | 331/1 A |

* cited by examiner

Primary Examiner—Timothy P. Callahan
Assistant Examiner—Minh Nguyen
(74) Attorney, Agent, or Firm—Wagner, Murabito & Hao LLP

(57) ABSTRACT

The lock detector circuit determines and indicates whether the PLL is in an in-lock mode or in an out-of-lock mode without using an external capacitor for controlling phase error. Moreover, the lock detector circuit indicates the operating mode of the PLL on a period-by-period basis relative to the period of the reference and feedback signals. Thus, the lock detector circuit provides real-time indication of the operating mode of the PLL.

34 Claims, 3 Drawing Sheets

LOCK DETECTOR FOR DETERMINING PHASE LOCK CONDITION IN PLL ON A PERIOD-BY-PERIOD BASIS ACCORDING TO DESIRED PHASE ERROR

BACKGROUND OF THE INVENTION

1. Field of the Invention

The present invention generally relates to phase lock loop circuits. More particularly, the present invention relates to the field of lock detector circuits, without having an external capacitor to specify a desired phase error, for determining phase lock condition in a phase lock loop circuit.

2. Related Art

Phase lock loop (PLL) circuits have been one of the basic building blocks in modern electronic systems. They have been widely used in communications, multimedia, and other applications. Frequency synthesizers, FM demodulators, clock recovery circuits, data synchronizers, modems, and tone decoders are some applications for PLLs.

PLLs are negative feedback control systems. A PLL generally comprises a phase-frequency detector, a charge pump, a low pass filter, a voltage-controlled oscillator (VCO), and a frequency divider. The phase-frequency detector generates an up signal and/or a down signal based on the difference in phase (and frequency) between a reference signal and a feedback signal. The phase-frequency detector is followed by the charge pump and the low pass filter. Continuing, these components provide a DC signal based on the up signal and/or the down signal from the phase-frequency detector. The voltage-controlled oscillator (VCO) follows the low pass filter. In particular, the VCO generates a high frequency VCO output signal controlled by the DC signal. Then, the frequency divider generates the low frequency feedback signal based on the high frequency VCO output signal. The feedback signal is fed to an input of the phase-frequency detector. In an in-lock mode of the PLL, the reference signal and the feedback signal are locked in phase (and frequency). In an out-of-lock mode of the PLL, the reference signal and the feedback signal are not locked in phase (and frequency).

An important aspect of PLL design is the lock detector circuit. The lock detector circuit generates a lock signal to indicate whether the PLL is operating in a in-lock mode or in a out-of-lock mode. FIG. 1 illustrates a conventional lock detector circuit 50 according to the prior art. As depicted in FIG. 1, the conventional lock detector circuit 50 receives the up signal 10 and the down signal 20 from the phase-frequency detector and generates the lock signal 30. Typically, a HIGH level lock signal 30 indicates an in-lock mode while a LOW level lock signal 30 indicates an out-of-lock mode. Typically, the PLL can make the phase difference between the reference signal and the feedback signal very small or can align these phases. However, parasitic losses, noisy systems, jitter, and other sources increase the phase difference between the reference signal and the feedback signal and prevent these signals from becoming synchronized. Depending on the application, a phase error is usually defined because perfect synchronization between the phases of the reference signal and the feedback signal is not always necessary. Generally, a phase difference of greater magnitude than the phase error corresponds to a PLL in an out-of-lock mode. Similarly, a phase difference of lesser magnitude than the phase error corresponds to a PLL in an in-lock mode.

As shown in FIG. 1, an external capacitor $C_{LD}$ is coupled to the conventional lock detector circuit 50. The external capacitor $C_{LD}$ is utilized to specify the phase error. In particular, the value of the external capacitor $C_{LD}$ is selected to correspond with the desired phase error (i.e., an acceptable pulse width in the up signal 10 and/or down signal 20 that does not cause the conventional lock detector circuit 50 to indicate the PLL is in an out-of-lock mode). Thus, if the phase difference (as indicated by the up signal 10 and/or down signal 20) between the reference signal and the feedback signal is no greater than the desired phase error, the lock signal 30 will have a HIGH level to indicate the PLL is in an in-lock mode. In contrast, if the phase difference (as indicated by the up signal 10 and/or down signal 20) between the reference signal and the feedback signal is greater than the desired phase error, the lock signal 30 will have a LOW level to indicate the PLL is in an out-of-lock mode. Generally, when the phase difference between the reference signal and the feedback signal has a small magnitude, the phase-frequency detector generates the up signal 10 and/or down signal 20 having a short pulse width. The external capacitor $C_{LD}$ is used to form a filter to remove short pulses (or ripples) from the up signal 10 and/or down signal 20, whereas these short pulses are removed because they are within the tolerance level specified by the desired phase error.

SUMMARY OF THE INVENTION

A lock detector circuit for a phase lock loop (PLL) circuit is described. The lock detector circuit determines and indicates whether the PLL is in an in-lock mode or in an out-of-lock mode without having an external capacitor for controlling phase error. Moreover, the lock detector circuit indicates the operating mode of the PLL on a period-by-period basis relative to the period of the reference and feedback signals. Thus, the lock detector circuit provides real-time indication of the operating mode of the PLL.

In an embodiment, the lock detector circuit is coupled to an up signal and a down signal from the PLL, whereas the up and down signals indicate the phase difference between the reference signal and the feedback signal. The lock detector circuit generates a first signal representing a non-overlapping portion of the up and down signals. Moreover, the lock detector circuit adds time delay to the first signal to form a second signal, whereas the time delay is dependent on a desired phase error between the reference and feedback signals. In an embodiment, one or more D-type flip-flops arranged in series provide the time delay, whereas the D-type flip-flops are clocked by the VCO output signal generated by the voltage-controlled oscillator (VCO) of the PLL. Next, a third signal is generated, whereas the third signal indicates whether the first and second signals overlap. Continuing, the lock detector circuit detects the period of the reference and feedback signals and generates an output signal using the third signal to indicate on a period-by-period basis the operating mode of the PLL, whereas the output signal indicates the operating mode within a tolerance level specified by the desired phase error.

These and other advantages of the present invention will no doubt become apparent to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 2:
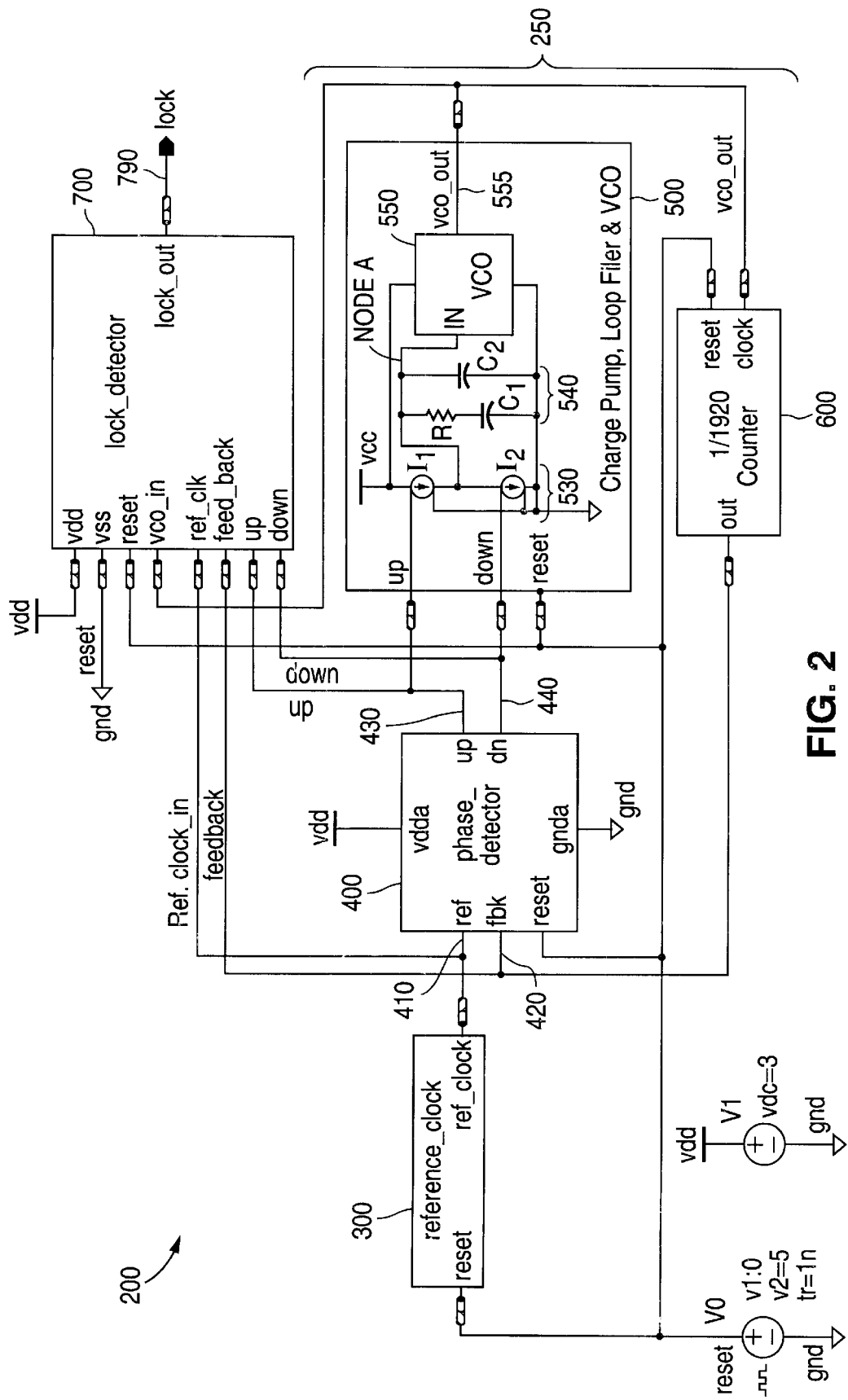
FIG. 2 illustrates a block diagram of a circuit having a phase lock loop (PLL) circuit and a lock detector circuit in accordance with an embodiment of the present invention.

FIG. 2 illustrates a block diagram of a circuit 200 having a phase lock loop (PLL) circuit 250 and a lock detector circuit 700 in accordance with an embodiment of the present invention. The lock detector circuit 700 of the present invention outputs a lock signal 790 to indicate whether the PLL 250 is operating in the in-lock mode or in the out-of-lock mode, whereas the lock detector circuit 700 does not have an external capacitor to control phase error. Moreover, the lock detector circuit 700 indicates the operating mode of the PLL 250 on a period-by-period basis relative to the period of the reference and feedback signals of the PLL 250. Thus, the lock detector circuit 700 provides real-time indication of the operating mode of the PLL 250.

In an embodiment, the PLL 250 includes a reference signal source 300, a phase-frequency detector 400, a circuit 500, and a frequency divider circuit 600. The circuit 500 comprises a charge pump 530, a low pass filter 540, and a voltage controlled oscillator (VCO) 550. The circuit 200 can be used to recover a pixel clock based on the horizontal sync (i.e., the reference signal) in LCD (liquid crystal display) monitor and DTV (digital television) applications. It should be understood that the lock detector circuit 700 and the PLL 250 can have other configurations.

The phase-frequency detector 400 receives the reference signal 410 and the feedback signal 420 and generates an up signal 430 and/or a down signal 440 to indicate the phase difference between the reference 410 and the feedback 420 signals. Generally, the up signal 430 has a pulse width that is proportional to the phase difference between the rising edge of the reference signal 410 and the rising edge of the feedback signal 420, when the rising edge of the reference signal 410 is the leading edge. Moreover, the down signal 440 has a pulse width that is proportional to the phase difference between the rising edge of the feedback signal 420 and the rising edge of the reference signal 410, when the rising edge of the feedback signal 420 is the leading edge. However, when the rising edge of the reference signal 410 and the feedback signal 420 are aligned, the up signal 430 and the down signal 440 do not have a pulse width or have a very short pulse width. Similarly, when the rising edge of the reference signal 410 and the feedback signal 420 are nearly synchronized (or aligned), the up signal 430, the down signal 440, or both signals have very short pulse widths.

In response to the up signal 430 and the down signal 440, the charge pump 530 and the low pass filter 540 provide a DC voltage at Node A, which is the VCO input. The charge pump 530 comprises a first current source $I_1$ and a second current source $I_2$. In practice, the up signal 430 activates the first current source $I_1$, charging Node A. The down signal 440 activates the second current source $I_2$, discharging Node A. Continuing, the low pass filter 540 comprises a resistor R, a first capacitor $C_1$, and a second capacitor $C_2$.

The VCO 550 generates a VCO output signal 555 having a frequency that is proportional to the voltage at the VCO input (i.e., Node A). Furthermore, the frequency divider 600 generates the feedback signal 420 based on the VCO output signal 555. In an embodiment, the frequency divider 600 comprises a counter 600 that generates the feedback signal 420 having a frequency that is 1/N times the frequency of the VCO output signal 555, whereas N can be any value, such as 1920.

Figure 1:
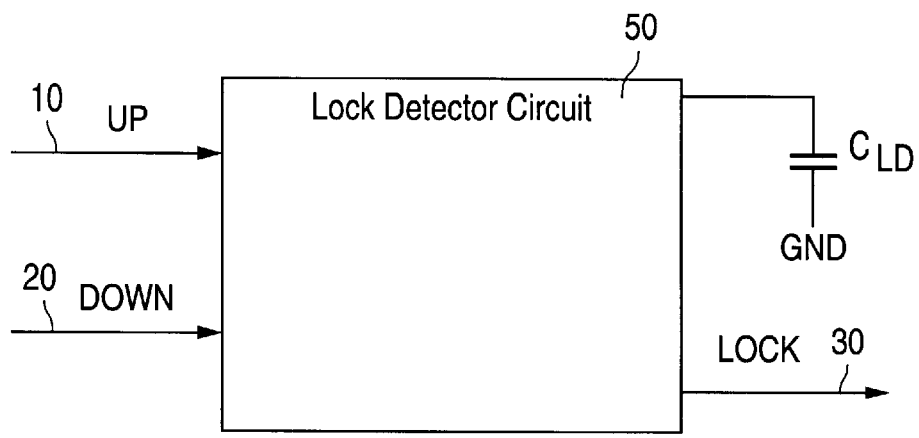
FIG. 1 illustrates a conventional lock detector circuit according to the prior art.

In an embodiment, the lock detector circuit 700 receives the reference signal 410, the feedback signal 420, the up signal 430, the down signal 440, and the VCO output signal 555. In response to these signals, the lock detector circuit 700 outputs the lock signal 790 to indicate whether the PLL 250 is operating in the in-lock mode or in the out-of-lock mode. In particular, the lock detector circuit 700 indicates on a period-by-period basis the operating mode of the PLL. Specifically, the lock signal 790 is updated each period (or clock cycle) of the reference and feedback signals to indicate the current operating mode of the PLL 250. In comparison to the conventional lock detector circuit 50 (FIG. 1), the lock detector circuit 700 of the present invention provides a faster indication or more instantaneous indication of the current operating mode of the PLL 250.

Moreover, the lock detector circuit 700 includes a time delay circuit which utilizes the VCO output signal 555. Rather than using an external capacitor to specify the desired phase error, the lock detector circuit 700 has the time delay circuit to facilitate specifying a desired phase error (i.e., an acceptable pulse width in the up signal 10 and/or down signal 20 that does not cause the lock signal 790 to indicate the PLL 250 is in the out-of-lock mode). As described above, the desired phase error is usually defined because perfect synchronization between the phases of the reference signal and the feedback signal is not always necessary. Generally, a phase difference of greater magnitude than the desired phase error causes the lock signal 790 to indicate the PLL 250 is operating in an out-of-lock mode. Similarly, a phase difference of lesser magnitude than the desired phase error causes the lock signal 790 to indicate the PLL 250 is operating in an in-lock mode.

Figure 3:
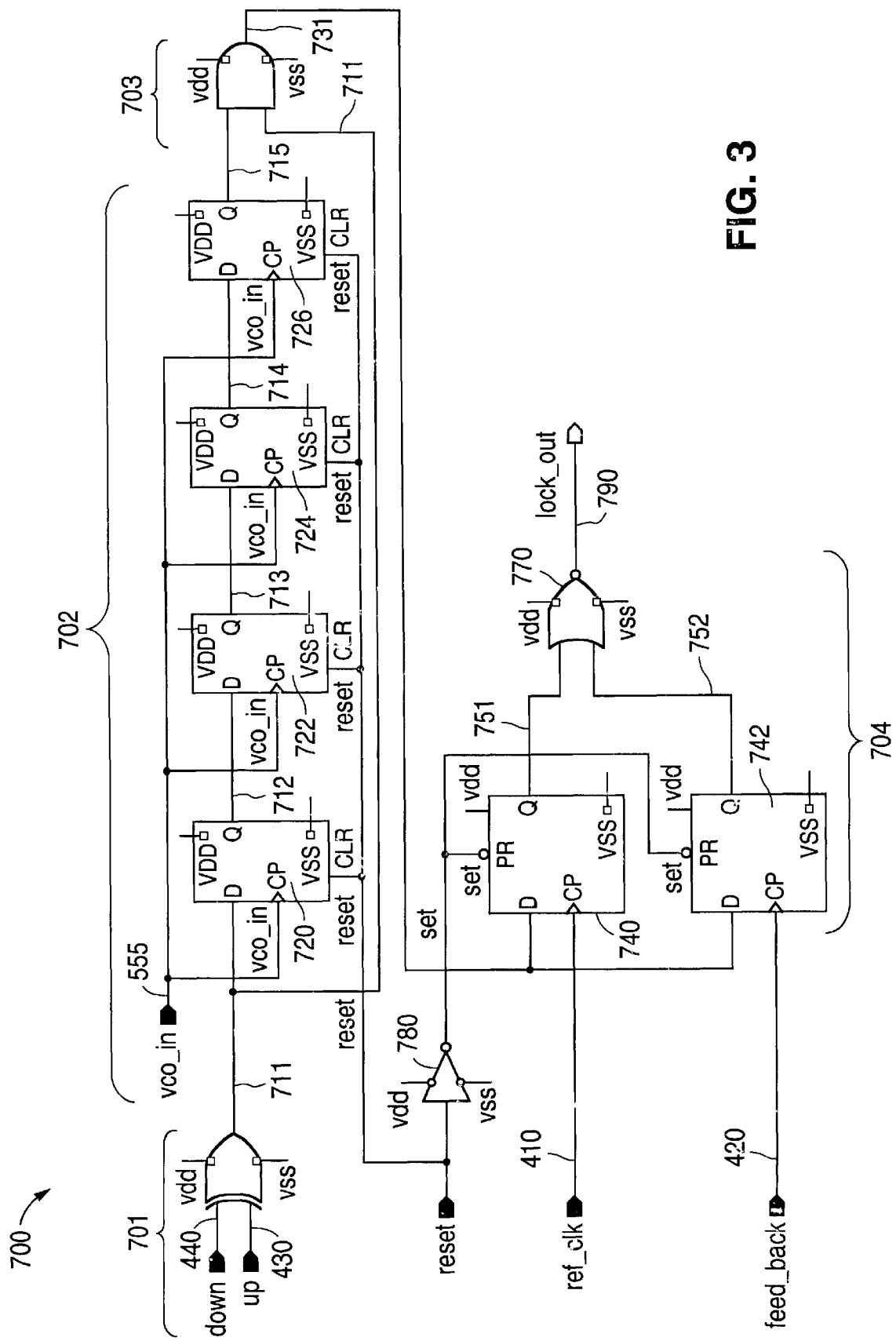
FIG. 3 illustrates a lock detector circuit in accordance with an embodiment of the present invention.

FIG. 3 illustrates a lock detector circuit 700 in accordance with an embodiment of the present invention. As depicted in FIG. 3, the lock detector circuit 700 includes a first stage filter 701, a second stage filter 702, a AND circuit 703, and a detector circuit 704. It should be understood that the lock detector circuit 700 can have other configurations.

In an embodiment, the first stage filter 701 comprises a XOR circuit 701. The XOR circuit 701 receives the up signal 430 and the down signal 440 generated by the phase-frequency detector 400 (FIG. 2). Moreover, the XOR circuit 701 generates a first signal at its output 711. The first signal represents a non-overlapping portion of the up signal 430 and the down signal 440. For example, if the up signal 430 has a pulse beginning at T=t1 and ending at T=t2 and if the down signal 440 has a pulse beginning at T=t1 and ending at T=t3, the first signal at output 711 will have a pulse beginning at T=t2 and ending at T=t3 to indicate the existence of an actual phase difference between the reference signal 410 and the feedback signal 420. Similarly, if the up signal 430 and the down signal 440 have equivalent pulse widths, the first signal will not have a pulse width and will remain at a logic LOW state to indicate the reference signal 410 and the feedback signal 420 are synchronized. The XOR circuit 701 filters out overlapping pulses of the up signal 430 and the down signal 440. As described above, when the rising edge of the reference signal 410 and the feedback signal 420 are approximately synchronized, the up signal 430 and the down signal 440 have very short pulse widths.

The second stage filter 702 comprises a time delay circuit 702. The time delay circuit 702 is coupled to the output 711 of the XOR circuit 701 and receives the first signal from the XOR circuit 701. In particular, the time delay circuit 702 adds time delay to the first signal and generates at its output 715 a second signal representing a time-shifted version of the first signal.

In an embodiment, the time delay circuit 702 comprises one or more D-type flip-flops 720, 722, 724, and 726 arranged in series (e.g., a shift register configuration). The D-type flip-flops 720, 722, 724, and 726 are clocked by the VCO output signal 555 (i.e., rising edge). It should be understood that the D-type flip-flops can be clocked by any other signal. Each D-type flip-flop 720, 722, 724, and 726 has a RESET terminal. The output 711 of the XOR circuit 701 is coupled to the input of the D-type flip-flop 720. The output of D-type flip-flop 720 is coupled to the input of D-type flip-flop 722 via connection 712. The output of D-type flip-flop 722 is coupled to the input of D-type flip-flop 724 via connection 713. The output of D-type flip-flop 724 is coupled to the input of D-type flip-flop 726 via connection 714. The output of the D-type flip-flop 726 is coupled to the input of the AND circuit 703 via connection 715. As illustrated in FIG. 3, the time delay circuit 702 has four D-type flip-flops 720, 722, 724, and 726. Hence, the time delay circuit 702 provides a time delay that is four cycles (or periods) of the VCO output signal 555. In other words, after four cycles of the VCO output signal 555, the second signal appears at output 715. It should be understood that the time delay circuit 702 can have other configurations and components.

As described above, the VCO output signal 555 has a significantly higher frequency than either the reference signal 410 or the feedback signal 420. Moreover, the time delay is dependent on the number of D-type flip-flops. An increase in the number of D-type flip-flops increases the time delay while a decrease in the number of D-type flip-flops decreases the time delay. More importantly, the time delay controls the desired phase error between the reference signal 410 and the feedback signal 420. As described above, a phase difference of greater magnitude than the desired phase error causes the lock detector circuit 700 to indicate the PLL 250 is operating in an out-of-lock mode. Similarly, a phase difference of lesser magnitude than the desired phase error causes the lock detector circuit 700 to indicate the PLL 250 is operating in an in-lock mode. An increase in the time delay increases the magnitude of the desired phase error while a decrease in the time delay decreases the magnitude of the desired phase error. Thus, the time delay is dependent on the desired phase error. In sum, the time delay circuit 702 filters out short pulses, which are within the tolerance level specified by the desired phase error, from the up signal 430 and the down signal 440.

The AND circuit 703 is coupled to the output 711 of the XOR circuit 701 and to the output 715 of the time delay circuit 702. Moreover, the AND circuit 703 receives the first signal from the XOR circuit 701 and the second signal from the time delay circuit 702. The AND circuit 703 generates a third signal at its output 731, whereas the third signal indicates whether the pulse of the first signal overlaps the pulse of the second signal. The case where the pulses do overlap (i.e., the third signal has a logic HIGH state) corresponds to the situation where the phase difference has a greater magnitude than the desired phase error, causing the lock detector circuit 700 to indicate the PLL 250 is operating in an out-of-lock mode. Moreover, the case where the pulses do not overlap (i.e., the third signal has a logic LOW state) corresponds to the situation where the phase difference has a lesser magnitude than the desired phase error, causing the lock detector circuit 700 to indicate the PLL 250 is operating in an in-lock mode.

In sum, the phase error filter circuit (which comprises the first stage filter 701, the second stage filter 702, and the AND circuit 703) filters out a portion of the phase difference indicated by the up signal 430 and the down signal 440 such that the portion represents the desired phase error between the reference signal 410 and the feedback signal 420. Moreover, the phase error filter circuit generates a signal representing a filtered phase difference rather than the actual phase difference, whereas the filtered phase difference takes into account the desired phase error.

Furthermore, the lock detector circuit 700 has the detector circuit 704. The detector circuit 704 receives the reference signal 410, the feedback signal 420, and the third signal from the AND circuit 703 via connection 731. Moreover, the detector circuit 704 detects the period of the reference signal 410 and the feedback signal 420. In response to the period of the reference signal 410 and the feedback signal 420, the detector circuit 704 generates the lock signal 790 that indicates on a period-by-period basis the operating mode of the PLL 250 within a tolerance level specified by the desired phase error.

In an embodiment, the detector circuit 704 comprises a first D-type flip-flop 740, a second D-type flip-flop 742, and a NOR circuit 770. The first D-type flip-flop 740 is coupled to the output 731 of the AND circuit 703 and receives the third signal as an input. Moreover, the first D-type flip-flop 740 is clocked by the reference signal 410 (i.e., rising edge). The output 751 of the first D-type flip-flop 740 is coupled to an input of the NOR circuit 770. The second D-type flip-flop 742 is coupled to the output 731 of the AND circuit 703 and receives the third signal as an input. Moreover, the second D-type flip-flop 742 is clocked by the feedback signal 420 (i.e., rising edge). The output 752 of the second D-type flip-flop 742 is coupled to an input of the NOR circuit 770. The first D-type flip-flop 740 and the second D-type flip-flop 742 each has a PRESET terminal which receives a set signal outputted by the inverter 780. In addition, the NOR circuit 770 outputs the lock signal 790, whereas a logic LOW indicates the PLL 250 is in an out-of-lock mode and a logic HIGH indicates the PLL 250 is in an in-lock mode. It should be understood that the detector circuit 704 can have other configurations and components.

As described above, the third signal generated by the AND circuit 703 has a logic HIGH state if the phase difference between the reference signal 410 and the feedback signal 420 has a greater magnitude than the desired phase error, thus indicating an out-of-lock mode. Moreover, the third signal generated by the AND circuit 703 has a logic LOW state if the phase difference has a lesser magnitude than the desired phase error, thus indicating an in-lock mode. In particular, the NOR circuit 770 outputs a lock signal 790 having a logic HIGH state (to indicate in-lock mode) when the first D-type flip-flop 740 has a signal having a logic LOW state at its output 751 and the second D-type flip-flop 742 has a signal having a logic LOW state at its output 752. Moreover, the NOR circuit 770 outputs a lock signal 790 having a logic LOW state (to indicate out-of-lock mode) when either the first D-type flip-flop 740 has a signal having a logic HIGH state at its output 751 or the second D-type flip-flop 742 has a signal having a logic HIGH state at its output 752. The signal at the output 751 and the signal at the output 752 are dependent on the value of the third signal (from the AND circuit 703) before the first and second D-type flip-flops 740 and 742 are clocked by the reference signal 410 and the feedback signal 420, respectively.

Since the first D-type flip-flop 740 updates the signal at its output 751 each period (or clock cycle) of the reference signal 410 and since the second D-type flip-flop 742 updates the signal at its output 752 each period (or clock cycle) of the feedback signal 420, the lock signal 790 is updated each period of the reference and feedback signals 410 and 420 to indicate the current operating mode of the PLL 250. Hence, the lock signal 790 indicates on a period-by-period basis the operating mode of the PLL 250. Specifically, the lock detector circuit 700 provides real-time indication of the operating mode of the PLL 250.

Figure 4:
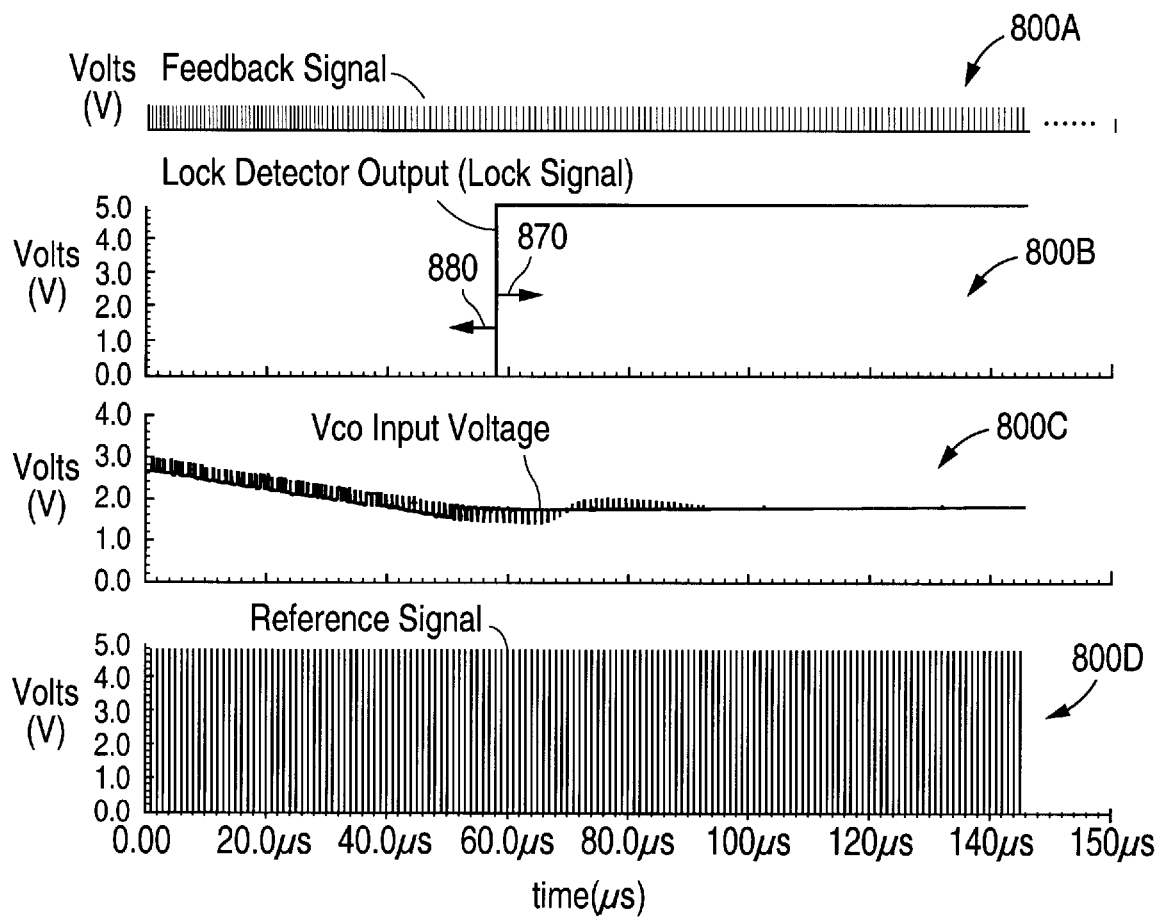
FIG. 4 illustrates a plurality of graphs showing the operation of the lock detector circuit of FIG. 3.

FIG. 4 illustrates a plurality of graphs 800A–800D showing the operation of the lock detector circuit 700 of FIG. 3. Graph 800A illustrates a feedback signal. Graph 800D illustrates a reference signal. Graph 800C illustrates the VCO input voltage (i.e., Node A in FIG. 2). As depicted in graph 800C, the value of the VCO input voltage fluctuates and then attains a steady state value. The fluctuation in the VCO input voltage is caused by the up signal 430 and the down signal 440 generated by the phase-frequency detector 400 to indicate the phase difference between the reference and the feedback signals, as described above.

Graph 800B illustrates the lock signal outputted by the lock detector circuit 700 of FIG. 3. From T=0 (microseconds) to T=approximately 60 (microseconds), the lock signal has a logic LOW state to indicate an out-of-lock mode. As depicted in Graph 800B, the lock signal switches to a logic HIGH state to indicate an in-lock mode at T=approximately 60 (microseconds), even though the VCO input voltage continues to fluctuate after T=approximately 60 (microseconds). In the period (or clock cycle) of the reference and feedback signals occurring at T=approximately 60 (microseconds) and in subsequent periods (or clock cycles), the phase difference between the reference and the feedback signals has a lesser magnitude than the desired phase error (which is controlled by the time delay in the time delay circuit 702). The arrow 870 indicates that the rising edge of the lock signal will occur after T=60 (microseconds) if the tolerance level is reduced (i.e., designing a smaller phase error) by reducing the time delay in the time delay circuit 702. The arrow 880 indicates that the rising edge of the lock signal will occur before T=60 (microseconds) if the tolerance level is increased (i.e., designing a larger phase error) by increasing the time delay in the time delay circuit 702.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A lock detector circuit for generating an output signal indicating an operating mode of a phase lock loop circuit having a phase-frequency detector circuit and a voltage controlled oscillator (VCO), comprising:

a first circuit configured to receive an up signal and a down signal each generated by said phase-frequency detector circuit and configured to generate a first signal representing a non-overlapping portion of said up and down signals, wherein said phase-frequency detector circuit generates said up and down signals to indicate a phase difference between a reference signal and a feedback signal;

a second circuit coupled to said first circuit and configured to receive said first signal, to add time delay to said first signal, and to output a second signal representing a time-shifted version of said first signal, wherein said time delay is dependent on a desired phase error between said reference and feedback signals, and wherein said second circuit is configured to receive a VCO output signal generated by said VCO;

a third circuit coupled to said first and second circuits and configured to receive said first and second signals and to output a third signal indicating whether said first and second signals overlap; and a detector circuit coupled to said third circuit and configured to receive said third signal, said reference signal, and said feedback signal, wherein said detector circuit is configured to detect period of said reference and feedback signals and to generate, using said third signal, said output signal that indicates in each period of said reference and feedback signals said operating mode within a tolerance level specified by said desired phase error.

2. A lock detector circuit as recited in claim 1 wherein said second circuit comprises one or more flip-flops arranged in series.

3. A lock detector circuit as recited in claim 1 wherein said feedback signal is based on said VCO output signal.

4. A lock detector circuit as recited in claim 1 wherein said time delay is dependent on said VCO output signal.

5. A lock detector circuit as recited in claim 1 wherein said second circuit comprises one or more flip-flops arranged in series, wherein said one or more flip-flops are clocked by said VCO output signal.

6. A lock detector circuit as recited in claim 1 wherein said first circuit comprises a XOR circuit.

7. A lock detector circuit as recited in claim 1 wherein said third circuit comprises an AND circuit.

8. A lock detector circuit as recited in claim 1 wherein said detector circuit comprises:
a first flip-flop configured to receive as input said third signal, wherein said first flip-flop has a first output and is clocked by said reference signal;
a second flip-flop configured to receive as input said third signal, wherein said second flip-flop has a second output and is clocked by said feedback signal; and
a NOR circuit coupled to said first and second outputs and configured to generate said output signal.

9. A lock detector circuit as recited in claim 1 wherein said operating mode is one of an in-lock mode and an out-of-lock mode.

10. A circuit comprising:
a phase lock loop circuit having:
a phase-frequency detector circuit configured to generate an up signal and a down signal to indicate a phase difference between a reference signal and a feedback signal; and
a voltage controlled oscillator (VCO) configured to generate a VCO output signal; and
a lock detector circuit for generating an output signal indicating an operating mode of said phase lock loop circuit, comprising:
a first circuit configured to receive said up and down signals and configured to generate a first signal representing a non-overlapping portion of said up and down signals;
a second circuit coupled to said first circuit and configured to receive said first signal, to add time delay to said first signal, and to output a second signal representing a time-shifted version of said first signal, wherein said time delay is dependent on a desired phase error between said reference and feedback signals, and wherein said second circuit is configured to receive said VCO output signal;
a third circuit coupled to said first and second circuits and configured to receive said first and second signals and to output a third signal indicating whether said first and second signals overlap; and
a detector circuit coupled to said third circuit and configured to receive said third signal, said reference signal, and said feedback signal, wherein said detector circuit is configured to detect period of said reference and feedback signals and to generate, using said third signal, said output signal that indicates in each period of said reference and feedback signals said operating mode within a tolerance level specified by said desired phase error.

11. A circuit as recited in claim 10 wherein said second circuit comprises one or more flip-flops arranged in series.

12. A circuit as recited in claim 10 wherein said feedback signal is based on said VCO output signal.

13. A circuit as recited in claim 10 wherein said time delay is dependent on said VCO output signal.

14. A circuit as recited in claim 10 wherein said second circuit comprises one or more flip-flops arranged in series, wherein said one or more flip-flops are clocked by said VCO output signal.

15. A circuit as recited in claim 10 wherein said first circuit comprises a XOR circuit.

16. A circuit as recited in claim 10 wherein said third circuit comprises an AND circuit.

17. A circuit as recited in claim 10 wherein said detector circuit comprises:
a first flip-flop configured to receive as input said third signal, wherein said first flip-flop has a first output and is clocked by said reference signal;
a second flip-flop configured to receive as input said third signal, wherein said second flip-flop has a second output and is clocked by said feedback signal; and
a NOR circuit coupled to said first and second outputs and configured to generate said output signal.

18. A circuit as recited in claim 10 wherein said phase lock loop circuit further comprises:
a charge pump circuit coupled to said phase-frequency detector circuit; and
a low pass filter circuit coupled to said charge pump circuit and to said voltage controlled oscillator (VCO).

19. A circuit as recited in claim 18 wherein said phase lock loop circuit further comprises: a frequency divider circuit coupled to said voltage controlled oscillator (VCO) and to said phase-frequency detector circuit, wherein said frequency divider circuit generates said feedback signal.

20. A circuit as recited in claim 10 wherein said operating mode is one of an in-lock mode and an out-of-lock mode.

21. A lock detector circuit for generating an output signal indicating an operating mode of a phase lock loop circuit having a phase-frequency detector circuit and a voltage controlled oscillator (VCO), comprising:
a phase error filter circuit configured to receive an up signal and a down signal each generated by said phase-frequency detector circuit, wherein said phase-frequency detector circuit generates said up and down signals to indicate a phase difference between a reference signal and a feedback signal, wherein said phase error filter circuit filters out a portion of said phase difference such that said portion represents a desired phase error between said reference and feedback signals, and wherein said phase error filter circuit generates a first signal representing a filtered phase difference; and
a detector circuit coupled to said phase error filter circuit and configured to receive said first signal, said reference signal, and said feedback signal, wherein said detector circuit is configured to detect period of said reference and feedback signals and to generate, using said first signal, said output signal that indicates in each period of said reference and feedback signals said operating mode within a tolerance level specified by said desired phase error, wherein said detector circuit comprises:
a first flip-flop configured to receive as input said first signal, wherein said first flip-flop has a first output and is clocked by said reference signal;
a second flip-flop configured to receive as input said first signal, wherein said second flip-flop has a second output and is clocked by said feedback signal; and
a NOR circuit coupled to said first and second outputs and configured to generate said output signal.

22. A lock detector circuit as recited in claim 21 wherein said phase error filter circuit comprises:
an XOR circuit configured to receive said down and up signals and having an XOR output;
a time delay circuit coupled to said XOR output and having a first output; and
an AND circuit coupled to said XOR output and to said first output, wherein said AND circuit generates said first signal.

23. A lock detector circuit as recited in claim 22 wherein said time delay circuit comprises one or more flip-flops arranged in series.

24. A lock detector circuit as recited in claim 23 wherein said one or more flip-flops are clocked by a VCO output signal generated by said VCO.

25. A lock detector circuit as recited in claim 21 wherein said operating mode is one of an in-lock mode and an out-of-lock mode.

26. A circuit comprising:

a phase lock loop circuit having:

a phase-frequency detector circuit configured to generate an up signal and a down signal to indicate a phase difference between a reference signal and a feedback signal; and a voltage controlled oscillator (VCO) configured to generate a VCO output signal; and a lock detector circuit for generating an output signal indicating an operating mode of said phase lock loop circuit, comprising:

a phase error filter circuit configured to receive said up and down signals, wherein said phase error filter circuit filters out a portion of said phase difference such that said portion represents a desired phase error between said reference and feedback signals, and wherein said phase error filter circuit generates a first signal representing a filtered phase difference; and a detector circuit coupled to said phase error filter circuit and configured to receive said first signal, said reference signal, and said feedback signal, wherein said detector circuit is configured to detect period of said reference and feedback signals and to generate, using said first signal, said output signal that indicates in each period of said reference and feedback signals said operating mode within a tolerance level specified by said desired phase error, wherein said detector circuit comprises:

a first flip-flop configured to receive as input said first signal, wherein said first flip-flop has a first output and is clocked by said reference signal;

a second flip-flop configured to receive as input said first signal, wherein said second flip-flop has a second output and is clocked by said feedback signal; and a NOR circuit coupled to said first and second outputs and configured to generate said output signal.

27. A circuit as recited in claim 26 wherein said phase error filter circuit comprises:

an XOR circuit configured to receive said down and up signals and having an XOR output;

a time delay circuit coupled to said XOR output and having a first output; and an AND circuit coupled to said XOR output and to said first output, wherein said AND circuit generates said first signal.

28. A circuit as recited in claim 27 wherein said time delay circuit comprises one or more flip-flops arranged in series.

29. A circuit as recited in claim 28 wherein said one or more flip-flops are clocked by a VCO output signal generated by said VCO.

30. A circuit as recited in claim 26 wherein said operating mode is one of an in-lock mode and an out-of-lock mode.

31. A circuit as recited in claim 26 wherein said phase lock loop circuit further comprises:

a charge pump circuit coupled to said phase-frequency detector circuit; and a low pass filter circuit coupled to said charge pump circuit and to said voltage controlled oscillator (VCO).

32. A circuit as recited in claim 31 wherein said phase lock loop circuit further comprises: a frequency divider circuit coupled to said voltage controlled oscillator (VCO) and to said phase-frequency detector circuit, wherein said frequency divider circuit generates said feedback signal.

33. A method of indicating an operating mode of a phase lock loop circuit, comprising the steps of:

a) receiving an up signal and a down signal, wherein said up and down signals indicate a phase difference between a reference signal and a feedback signal;

b) generating a first signal representing a non-overlapping portion of said up and down signals;

c) receiving a VCO output signal generated by a voltage controlled oscillator (VCO) and adding time delay to said first signal to form a second signal, wherein said time delay is dependent on a desired phase error between said reference and feedback signals;

d) generating a third signal indicating whether said first and second signals overlap;

e) detecting period of said reference and feedback signals; and f) generating an output signal using said third signal to indicate in each period of said reference and feedback signals said operating mode within a tolerance level specified by said desired phase error.

34. A method as recited in claim 33 wherein said operating mode is one of an in-lock mode and an out-of-lock mode.

* * * * *